US009362895B2

(12) United States Patent
Seth et al.

(10) Patent No.: US 9,362,895 B2
(45) Date of Patent: Jun. 7, 2016

(54) APPARATUS AND METHOD FOR HYBRID DIFFERENTIAL ENVELOPE DETECTOR AND FULL-WAVE RECTIFIER

(71) Applicant: Samsung Electronics Co., Ltd., Gyeonggi-do (KR)

(72) Inventors: Siddharth Seth, San Jose, CA (US); Sang Won Son, Palo Alto, CA (US); Thomas Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/821,270

(22) Filed: Aug. 7, 2015

(65) Prior Publication Data

US 2016/0072481 A1 Mar. 10, 2016

Related U.S. Application Data

(60) Provisional application No. 62/046,734, filed on Sep. 5, 2014.

(51) Int. Cl.
*H03D 1/14* (2006.01)
*H02M 7/217* (2006.01)
*H03K 3/012* (2006.01)

(52) U.S. Cl.
CPC ............. *H03K 3/012* (2013.01); *H02M 7/217* (2013.01)

(58) Field of Classification Search
CPC ............ H02M 2/217; H02J 7/025; H02J 7/04
USPC ............... 327/65, 58, 62, 103, 565, 104, 303; 363/127
See application file for complete search history.

(56) References Cited

U.S. PATENT DOCUMENTS

| 4,250,457 | A | * | 2/1981 | Hofmann | ................. | H03D 1/18 327/104 |
| 4,445,054 | A | * | 4/1984 | Ishii | ........................ | H03D 1/18 327/104 |
| 4,485,348 | A | * | 11/1984 | Perkins | .................... | H03D 1/18 327/104 |
| 6,137,375 | A | | 10/2000 | Li | | |
| 6,774,617 | B2 | | 8/2004 | Andoh | | |
| 6,836,156 | B2 | | 12/2004 | Chien | | |
| 7,095,256 | B1 | | 8/2006 | Zhak et al. | | |
| 7,157,944 | B1 | | 1/2007 | Wang et al. | | |
| 7,348,808 | B2 | | 3/2008 | Moussavi | | |
| 7,495,940 | B2 | | 2/2009 | Cheng | | |
| 7,592,867 | B2 | | 9/2009 | Trifonov et al. | | |

(Continued)

OTHER PUBLICATIONS

Yu-Wei Lin et al., "Series-resonant VHF micromechanical resonator reference oscillators," IEEE Journal of Solid-State Circuits, vol. 39, No. 12, pp. 2477-2491, Dec. 2004.

*Primary Examiner* — Dinh T Le
(74) *Attorney, Agent, or Firm* — The Farrell Law Firm, P.C.

(57) ABSTRACT

A first and second hybrid envelope detector and full-wave rectifier is provided. The first hybrid envelope detector and full-wave rectifier includes a first P-channel Field Effect Transistor (PFET); a second PFET; a first N-channel Field Effect Transistor (NFET); a second NFET; a third NFET; a fourth NFET; a fifth NFET; a controller; a variable transistor; and a variable capacitor. The second hybrid envelope detector and full-wave rectifier includes a first N-channel Field Effect Transistor (NFET); a second NFET; a first P-channel Field Effect Transistor (PFET); a second PFET; a third PFET; a fourth PFET; a fifth PFET; a controller; a variable transistor; and a variable capacitor.

20 Claims, 6 Drawing Sheets

(56) References Cited

U.S. PATENT DOCUMENTS

| | | |
|---|---|---|
| 8,242,429 B2 | 8/2012 | Sarpeshkar et al. |
| 8,461,926 B2 | 6/2013 | Mineyama et al. |
| 8,497,711 B2 | 7/2013 | Hsieh |
| 8,665,018 B2 | 3/2014 | Strange et al. |
| 8,688,060 B2 | 4/2014 | Sudjian |
| 2014/0084995 A1 | 3/2014 | Hadji-Abdolhamid et al. |
| 2014/0085007 A1 | 3/2014 | Hadji-Abdolhamid et al. |
| 2014/0269866 A1 | 9/2014 | Wang et al. |

* cited by examiner

APPARATUS AND METHOD FOR HYBRID DIFFERENTIAL ENVELOPE DETECTOR AND FULL-WAVE RECTIFIER

PRIORITY

This application claims priority under 35 U.S.C. §120 to a U.S. Provisional Patent Application filed on Sep. 5, 2014 in the United States Patent and Trademark Office and assigned Ser. No. 62/046,734, the entire contents of which are incorporated herein by reference.

BACKGROUND OF THE DISCLOSURE

1. Field of the Disclosure

The present disclosure relates generally to a hybrid differential envelope detector and full-wave rectifier, and more particularly, to a low-power and low-area hybrid differential envelope detector and full-wave rectifier.

2. Description of the Related Art

In electronic systems used in the fields of wireless communication (e.g. cellular radio integrated circuits, etc.), wired communication (e.g., serial links, display adapters, etc.) and biomedical systems (e.g., medical imaging integrated circuits, etc.), there is a need to extract a rectified amplitude or an envelope of an electronic signal. Such an extracted version of a signal may then be used to bias an electronic circuit that conditions the signal. Such rectification or envelope detection can be used to adaptively bias signal processing circuits or can be used as a signal strength indicator that can be utilized for event-based triggering of certain systems.

Conventionally, a rectification circuit and an envelope detection circuit are two separate circuits having two different circuit designs, where one circuit performs rectification while the other circuit performs envelope detection. Conventional circuits do not provide a single circuit that can perform both rectification and envelope detection. In addition, rectification circuits and envelope detection circuits receive a single-ended input and provide a single-ended output voltage.

SUMMARY

The present disclosure has been made to address the above-mentioned problems and disadvantages, and to provide at least the advantages described below.

Accordingly, an aspect of the present disclosure is to provide a hybrid differential envelope detector and full-wave rectifier.

Another aspect of the present disclosure is to provide a hybrid differential envelope detector and full-wave rectifier that is selectable via a variable transistor and a variable capacitor.

Another aspect of the present disclosure is to provide a hybrid differential envelope detector and full-wave rectifier that receives a differential input voltage and outputs a single-ended voltage.

Another aspect of the present disclosure is to provide a hybrid differential envelope detector and full-wave rectifier that receives a differential input voltage and outputs a single-ended voltage that is converted into a current.

Another aspect of the present disclosure is to provide a hybrid differential envelope detector and full-wave rectifier where the minimum output voltage or current can be changed by changing the relative sizing of input transistors.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
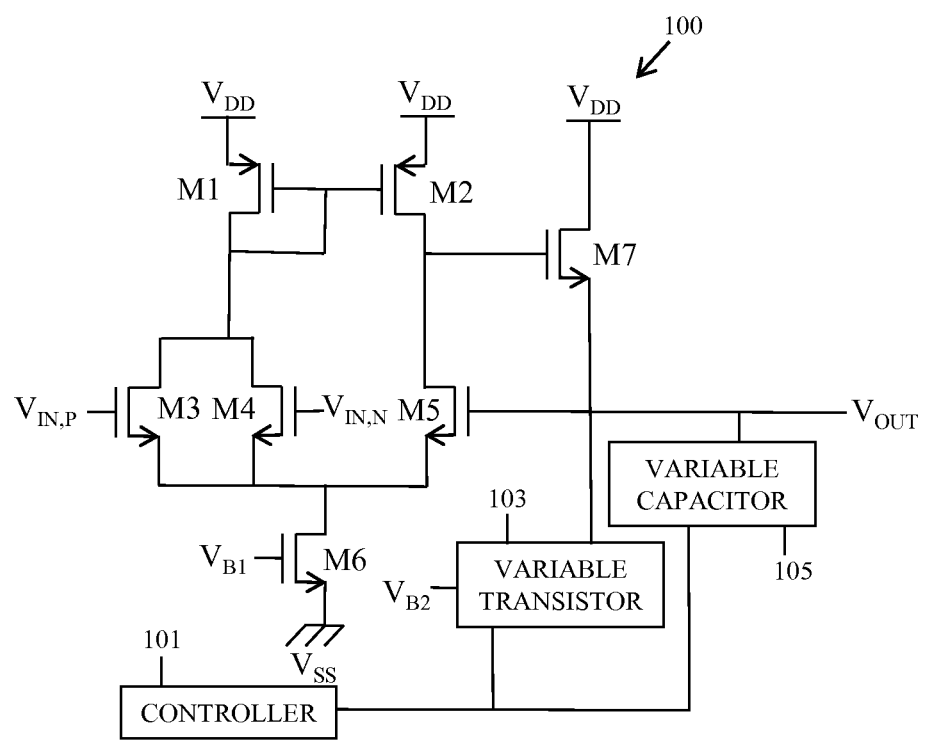
FIG. 1 is a schematic diagram of a combination differential envelope detector and full-wave rectifier according to an embodiment of the present disclosure.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments will now be described in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

Although the following description of the embodiments of the present disclosure uses terms and names defined for Complementary Metal Oxide Semiconductor (CMOS) Field Effect Transistors (FETs) (i.e., N-channel MOSFETs (NMOS), or NFETs, and P-channel MOSFETs (PMOS), or PFETs), the present disclosure is not limited by these terms and names, and is identically applicable to other similar technologies (e.g., NMOS, PMOS, Fin-shaped FET (FinFET), Bipolar, Gallium Arsenide (GaAs), Indium GaAs (InGaAs), etc.).

The present disclosure describes a hybrid differential envelope detector and full-wave rectifier. By combining the two functions into one circuit, the hybrid differential envelope detector and full-wave rectifier of the present disclosure consumes less power and occupies a smaller area of an integrated circuit than equivalent functions implemented as two separate circuits. In addition, the hybrid differential envelope detector and full-wave rectifier of the present disclosure receives a differential input signal and produces a single-ended output voltage or current that is referenced to a common mode voltage of the input signal. This allows the signal source to be symmetrically loaded, and allows implementation of a full-wave rectifier, instead of a half-wave rectifier.

The minimum output voltage or current swing above a common mode voltage of an input differential signal of the present disclosure is selectable by setting the relative sizing of input transistors. This allows the setting of a minimum signal level that the hybrid differential envelope detector and full-wave rectifier of the present disclosure can detect.

A variable transistor and a variable capacitor allow control over the speed at which an output voltage changes, and allows the implementation of a differential envelope detector and a hybrid full-wave-rectifier.

FIG. 1 is a schematic diagram of a hybrid differential envelope detector and full-wave rectifier 100 according to an embodiment of the present disclosure.

Referring to FIG. 1, the hybrid differential envelope detector and full-wave rectifier 100 includes a first PFET M1, a second PFET M2, a first NFET M3, a second NFET M4, a third NFET M5, a fourth NFET M6, a fifth NFET M7, a controller 101, a variable transistor 103, and a variable capacitor 105. However, the present disclosure is not limited to a hybrid envelope detector and full-wave rectifier 100 that uses NFETs and PFETs or is configured as illustrated in FIG. 1. Other types of transistors and arrangements are possible, as illustrated, for example, in FIG. 6 and described below. The hybrid differential envelope detector and full-wave rectifier 100 of the present disclosure may be implemented with just PFETs, just NFETs, or using any other suitable transistor type (e.g. CMOS, NMOS, PMOS, Bipolar, FinFET, GaAs, InGaAs, etc.).

The first PFET M1 has its source connected to a power supply voltage (e.g. $V_{DD}$), and its gate connected to its drain, the gate of the second PFET M2, the drain of the first NFET M3, and the drain of the second NFET M4.

The second PFET M2 has its source connected to the power supply voltage (e.g. $V_{DD}$), its gate connected to the gate of the first PFET M1, and its drain connected to the drain of the third NFET M5 and the gate of the fifth NFET M7.

The first NFET M3 has its drain connected to the drain of the first PFET M1 and the drain of the second NFET M4, its source connected to the source of the second NFET M4, the source of the third NFET M5, and the drain of the fourth NFET M6. The gate of the first NFET M3 is the positive terminal of the hybrid differential envelope detector and full-wave rectifier 100 and receives a positive differential input voltage (e.g., $V_{in,p}$).

The second NFET M4 has its drain connected to the drain of the first PFET M1 and the drain of the first NFET M3, and its source is connected to the source of the first NFET M3, the source of the third NFET M5, and the drain of the fourth NFET M6. The gate of the second NFET M4 is the negative terminal of the hybrid differential envelope detector and full-wave rectifier 100 and receives a negative differential input voltage (e.g., $V_{in,n}$).

The third NFET M5 has its source connected to the source of the first NFET M3, the source of the second NFET M4, and the drain of the fourth NFET M6. The drain of the third NFET M5 is connected to the drain of the second PFET M2 and the gate of the fifth NFET M7. The gate of the third NFET M5 is connected to the source of the fifth NFET M7, a drain input of the variable transistor 103, and a first terminal input of the variable capacitor 105. The output voltage (e.g. $V_{out}$) of the hybrid differential envelope detector and full-wave rectifier 100 appears at the gate of the third NFET M5.

The fourth NFET M6 has its source connected to a ground potential (e.g. $V_{SS}$) and its drain is connected to the source of the first NFET M3, the source of the second NFET M4, and the source of the third NFET M5. The gate of the fourth NFET M6 receives a first bias voltage (e.g., $V_{B1}$), which, in conjunction with the size of the fourth NFET M6, establishes a bias current $I_{bias}$ for the input stage of the hybrid differential envelope detector and full-wave rectifier 100.

The fifth NFET M7 has its drain connected to the power supply voltage (e.g. $V_{DD}$). The gate of the fifth NFET M7 is connected to the drain of the second PFET M2 and the drain of the third NFET M5. The source of the fifth NFET M7 is connected to the gate of the third NFET M5, the drain input of the variable transistor 103 and the first terminal input of the variable capacitor 105. The output voltage (e.g. $V_{out}$) of the hybrid differential envelope detector and full-wave rectifier 100 appears at the source of the fifth NFET M7.

A controller 101 is connected to a control input bus of the variable transistor 103 and a control input bus of the variable capacitor 105. The controller 101 controls the effective size (e.g. width) of the variable transistor 103 and the effective capacitance of the variable capacitor 105.

The variable transistor 103 has a gate input for receiving a second bias voltage (e.g. $V_{B2}$), a control input bus connected to the controller 101, and a drain input connected to the gate of the third NFET M5, the source of the fifth NFET M7, and the first terminal of the variable capacitor 105. The output voltage (e.g. $V_{out}$) of the hybrid differential envelope detector and full-wave rectifier 100 appears at the drain input of the variable transistor 103.

The variable capacitor 105 has a control input bus connected to the controller 101 and a terminal connected to the gate of the third NFET M5, the source of the fifth NFET M7, and the drain input of the variable transistor 103. The output voltage (e.g. $V_{out}$) of the hybrid differential envelope detector and full-wave rectifier 100 appears at the first terminal of the variable capacitor 105. Alternatively, the second terminal of the variable capacitor 105 may be connected to a predetermined Direct Current (DC) voltage other than the ground potential.

In an embodiment of the present disclosure, the first NFET M3, the second NFET M4, and the third NFET M5 have the same size (e.g. width). Thus, if either $V_{in,p}$ or $V_{in,n}$ is greater than $V_{out}$, then the third NFET M5 turns off and the voltage on the gate of the fifth NFET M7 rises, turning on the fifth NFET M7. Then, a charging current $I_{charge}$ flows from the source of the fifth NFET M7 to charge the effective capacitance C of the variable capacitor 105.

If either $V_{in,p}$ or is less than $V_{out}$, then the third NFET M5 turns on, which turns off the fifth NFET M7, and causes the voltage $V_{out}$ of the effective capacitance of the variable capacitor 105 to be discharged through the variable transistor 103 via a discharge current $I_{discharge}$.

The rate at which $V_{out}$ is discharged when the fifth NFET M7 is turned off is given by Equation (1) as follows:

$$\frac{dV_{out}}{dt} = -\frac{I_{discharge}}{C} \quad (1)$$

The rate at which the voltage $V_{out}$ rises when the fifth NFET M7 is turned on is given by Equation (2) as follows:

$$\frac{dV_{out}}{dt} = -\frac{I_{charge} - I_{discharge}}{C} \quad (2)$$

Note that the value of $I_{discharge}$ is controlled only by the effective size of the variable transistor 103, which can be changed to change the value of $I_{discharge}$. In addition, the value of $I_{charge}$ depends on the relative difference between the voltage $V_{out}$ and the maximum of the voltages $V_{in,p}$ and $V_{in,n}$.

A high loop gain in the hybrid differential envelope detector and full-wave rectifier 100 ensures that the static difference between $V_{out}$ and the peak voltage of $V_{in,p}$ or $V_{in,n}$ remains small. Thus, if the DC voltage on $V_{in,p}$ and $V_{in,n}$ is $V_{in,DC}$ volts and $V_{in,p}$ and $V_{in,n}$ swing $+/-V_{in,ac}$ volts, then the maximum voltage swing on $V_{out}$ is $V_{in,DC}+V_{in,ac}$ volts. When both $V_{in,p}$ and $V_{in,n}$ are close to their "zero-crossing" value of $V_{in,DC}$ volts, then the first NFET M3, the second NFET M4, and the third NFET M5 each supply $I_{bias}/4$, $I_{bias}/4$, and $I_{bias}/2$, respectively. Because the first NFET M3, the second NFET M4, and the third NFET M5 are the same size and have the same source voltage, the generated gate-to-source voltage on the third NFET M5 is greater than $V_{in,DC}$. Consequently, the generated Vout is slightly greater than $V_{in,DC}$ (e.g. by around 50 mV to 100 mV).

The effective value of the capacitance C and the discharge current $I_{discharge}$ determine how closely the voltage $V_{out}$ tracks the greater of the voltages $V_{in,p}$ and $V_{in,n}$. By switching the effective capacitance value of C between a low value (e.g. 0.1 pF) and a high value (e.g. 10 pF) the mode of the hybrid differential envelope detector and full-wave rectifier 100 is switched from that of a full-wave rectifier to that of a differential envelop detector.

When the capacitance C is 0.1 pF, $V_{out}$ exactly tracks the larger of the two voltages $V_{in,p}$ and $V_{in,n}$ and the hybrid differential envelop detector and full-wave rectifier 100 functions as a full-wave rectifier (i.e., $V_{out}$ is a full-wave rectified version of the greater of $V_{in,p}$ and $V_{in,n}$). When the capacitance value C is small, the $V_{out}$ node can be charged and discharged quickly.

When the capacitance C is 10 pF, $V_{out}$ slowly tracks the peaks of the two voltages $V_{in,p}$ and $V_{in,n}$ and the hybrid differential envelop detector and full-wave rectifier 100 functions as a differential envelope detector (i.e., $V_{out}$ is a peak detection version of the greater of $V_{in,p}$ and $V_{in,n}$). When the capacitance value C is large, the $V_{out}$ node is charged and discharged slowly (effectively reducing the bandwidth of the envelope detector), which switches the mode of the hybrid differential envelope detector and full-wave rectifier 100 to a differential envelope detector (e.g. a peak detector).

In an embodiment of the present disclosure, the hybrid differential envelope detector and full-wave rectifier 100 is switched to envelope detection mode for narrowband input signals such as a single tone (e.g., a 180 KHz wide signal centered around 9 MHz), a combination of two or more tones, a signal in the 4$^{th}$ Generation (4G) Long Term Evolution (LTE) system that is one resource block wide, etc., where the variable transistor 103 is controlled by the controller 101 to establish an $I_{discharge}$ current of 16 uA.

In an embodiment of the present disclosure, the hybrid differential envelope detector and full-wave rectifier 100 is switched to full-wave rectifier mode for wideband input signals (e.g., a 18 MHz wide signal centered around 0 MHz) such as a 2$^{nd}$ Generation (2G) Gaussian Minimum Shift Keying (GMSK) input signal, a 2G Enhanced Data rates for Global system for mobile communications Evolution (EDGE) input signal, a 3$^{rd}$ Generation (3G) Wideband Code Division Multiple Access (WCDMA), a 4G LTE input signal that is a full resource block wide, etc., where the variable transistor 103 is controlled by the controller 101 to establish an $I_{discharge}$ current of 20 uA.

Figure 2:
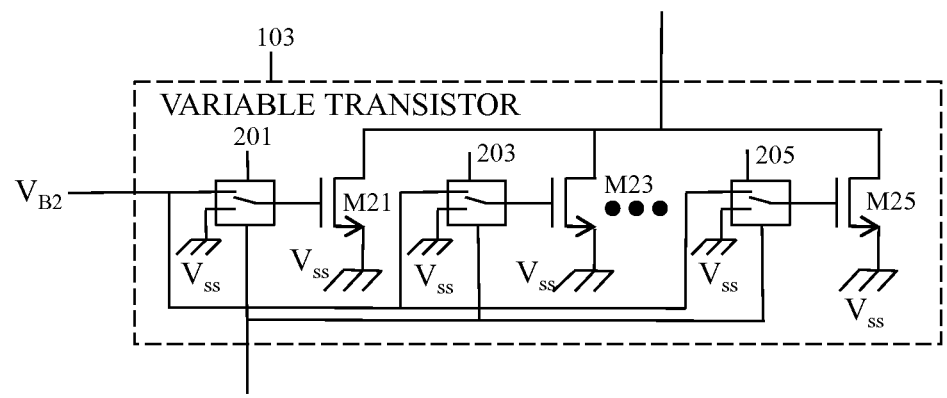
FIG. 2 is a schematic diagram of a variable transistor according to an embodiment of the present disclosure.

FIG. 2 is a schematic diagram of the variable transistor 103 according to an embodiment of the present disclosure.

Referring to FIG. 2, the variable transistor 103 includes n NFETs M21, M23, . . . , M25 and n switches 201, 203, . . . , 205. However, the present disclosure is not limited to a variable transistor 103 that uses NFETs or is configured as illustrated in FIG. 2. Other types of transistors and arrangements are possible, as illustrated, for example, in FIG. 7 and described below.

A bias voltage (e.g. $V_{B2}$) is received and connected to a first input terminal of each of the n switches 201, 203, . . . , 205. A second input terminal of each of the n switches 201, 203, . . . , 205 is connected to a ground potential (e.g., $V_{SS}$). A gate of each of the n NFETs M21, M23, . . . , M25 is connected to an output terminal of one of the n switches 201, 203, . . . , 205. A source of each of the n NFETs M21, M23, . . . , M25 is connected to the ground potential (e.g. Vss). A drain of each of the n NFETs is connected together to form the drain input of the variable transistor 103.

A control input bus, having n inputs for receiving n control bits from the controller 101, is connected to the n switches

201, 203, ..., 205, so that each control input of each of the n switches 201, 203, ..., 205 receives one of the n control bits from the controller 101, which causes either the bias voltage (e.g. $V_{B2}$) or the ground potential (e.g. $V_{SS}$) to be applied to one of the gates of n NFETs M21, M23, ..., M25. Applying the bias voltage (e.g. $V_{B2}$) to a gate of one of the n NFETs M21, M23, ..., M25 turns on the corresponding NFET, and applying a ground potential (e.g. $V_{SS}$) to a gate of one of the n NFETs M21, M23, ..., M25 turns off the corresponding NFET.

The control bits received from the controller 101 determine which of the n NFETs M21, M23, ..., M25 is turned on or turned off. The number of NFETs that are turned on and the sizes of the NFETS that are turned on determine $I_{discharge}$. The sizes of the n NFETs M21, M23, ..., M25 may be the same or they may be different from each other. If the sizes are different, the difference may be in a predetermined pattern (e.g., a ladder pattern for greater accuracy).

Figure 3:
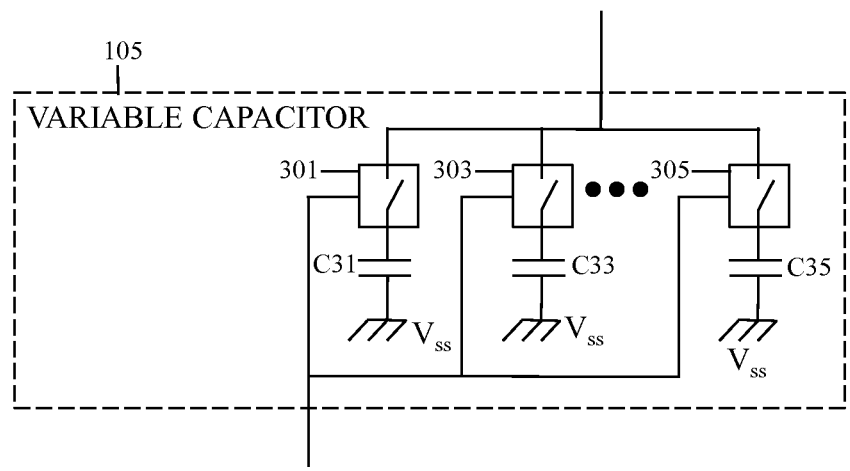
FIG. 3 is a schematic diagram of a variable capacitor according to an embodiment of the present disclosure.

FIG. 3 is a schematic diagram of the variable capacitor 105 according to an embodiment of the present disclosure.

Referring to FIG. 3, the variable capacitor 105 includes n capacitors C31, C33, ..., C35 and n switches 301, 303, ..., 305. However, the present disclosure is not limited to a variable capacitor 105 that is configured as illustrated in FIG. 3. Other types of arrangements are possible (e.g., series, series and parallel, etc.).

A first terminal of each of the n capacitors C31, C33, ..., C35 is connected to an input terminal of each of the n switches 301, 303, ..., 305. A second terminal of each of the n capacitors C31, C33, ..., C35 is connected to a ground potential (e.g., $V_{SS}$). A second terminal of each of the n switches 301, 303, ..., 305 is connected together to form the terminal of the variable capacitor 105. Alternatively, the second terminal of each of the n capacitors C31, C33, ..., C35 may be connected to a DC voltage other than the ground potential (e.g., $V_{SS}$).

A control input bus, having n inputs for receiving n control bits from the controller 101, is connected to the n switches 301, 303, ..., 305, so that each control input of each of the n switches 301, 303, ..., 305 receives one of the n control bits from the controller 101, which causes one of the n capacitors C31, C33, ..., C35 to be connected to, or disconnected from, the terminal of the variable capacitor 105.

The control bits received from the controller 101 determine which of the n capacitors C31, C33, ..., C35 is connected to the terminal of the variable capacitor 105. The number of capacitors that are connected to the terminal of the variable capacitor 105, the sizes of the capacitors, and $I_{discharge}$ determine how closely $V_{out}$ tracks the greater of $V_{in,p}$ and $V_{in,n}$. The sizes of the n capacitors C31, C33, ..., C35 may be the same or they may be different from each other. If the sizes are different, the difference may be in a predetermined pattern (e.g., a ladder pattern for greater accuracy).

Figure 4:
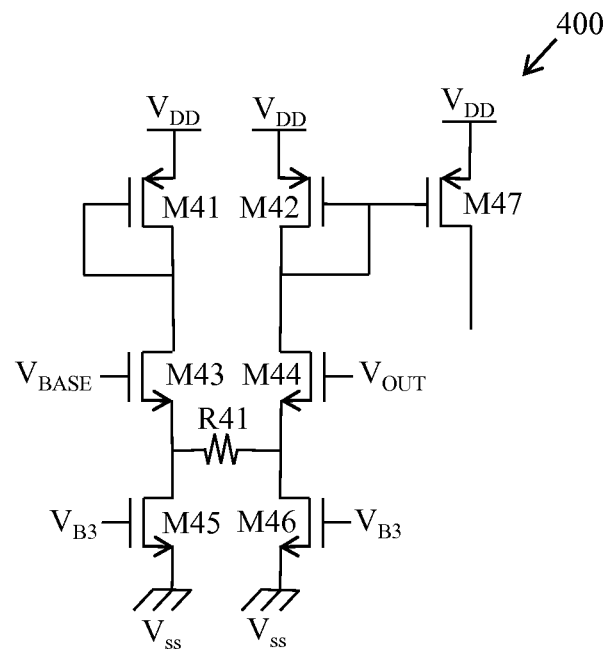
FIG. 4 is a schematic diagram of a transconductor according to an embodiment of the present disclosure.

FIG. 4 is a schematic diagram of a transconductor 400 according to an embodiment of the present disclosure for converting the voltage $V_{out}$ to a current $I_{out}$ that is proportional to $V_{out}$.

Referring to FIG. 4, the transconductor 400 (e.g. a source-degenerated differential amplifier with diode-connected loads) includes a first PFET M41, a second PFET M42, a third PFET M47, a first NFET M43, a second NFET M44, a resistor R41, a third NFET M45, and a fourth NFET M46. Other types of transistors and arrangements are possible, as illustrated, for example, in FIGS. 5, 9, and 10 and described below.

The first PFET M41 has a source connected to a power supply voltage (e.g. $V_{DD}$) and a gate connected to its drain and the drain of the first NFET M43, wherein the first PFET M41 is connected as a diode. The second PFET M42 has a source connected to a power supply voltage (e.g. $V_{DD}$) and a gate connected to its drain, the drain of the second NFET M44, and the gate of the third PFET M47, wherein the second PFET M42 is connected as a diode. The first NFET M43 has a drain connected to the drain and gate of the first PFET M41, a gate for receiving a reference voltage (e.g. $V_{BASE}$), and a source connected to a first end of a resistor R41 and the drain of the third NFET M45. The second NFET M44 has a drain connected to the gate of the third PFET M47 and the drain and gate of the second PFET M42. The second NFET M44 also has a gate for receiving $V_{out}$, and a source connected to a second end of the resistor R41 and the drain of the fourth NFET M46. The third NFET M45 has a drain connected to the source of the first NFET M43 and the first end of the resistor R41. The third NFET M45 also has a gate for receiving a bias voltage (e.g. $V_{B3}$) and a source connected to a ground potential (e.g. $V_{SS}$). The fourth NFET M46 has a drain connected to the source of the second NFET M44 and the second end of the resistor R41. The fourth NFET M46 also has a gate for receiving the bias voltage (e.g. $V_{B3}$) and a source connected to the ground potential (e.g. $V_{SS}$). The third PFET M47 has a source connected to the power supply voltage (e.g. $V_{DD}$) and a gate connected to the gate and drain of the second PFET M42 and the drain of the second NFET M44. $I_{out}$ appears at the drain of the second PFET M42 and is proportional to $V_{out}$. $I_{dynamic}$ appears at the drain of the third PFET M47 and is equal to $I_{out}$ times the size of the third PFET M47 divided by the size of the second PFET M42.

The $V_{BASE}$ voltage may be externally applied or internally generated using a Digital-to-Analog Converter (DAC). Changing $V_{BASE}$ changes the intercept of an $I_{out}$ versus $V_{out}$ curve. In addition, by changing the ratio of the size of the third PFET M47 to the size of the second PFET M42, the slope of an $I_{dynamic}$ versus $V_{out}$ curve can be changed.

Figure 5:
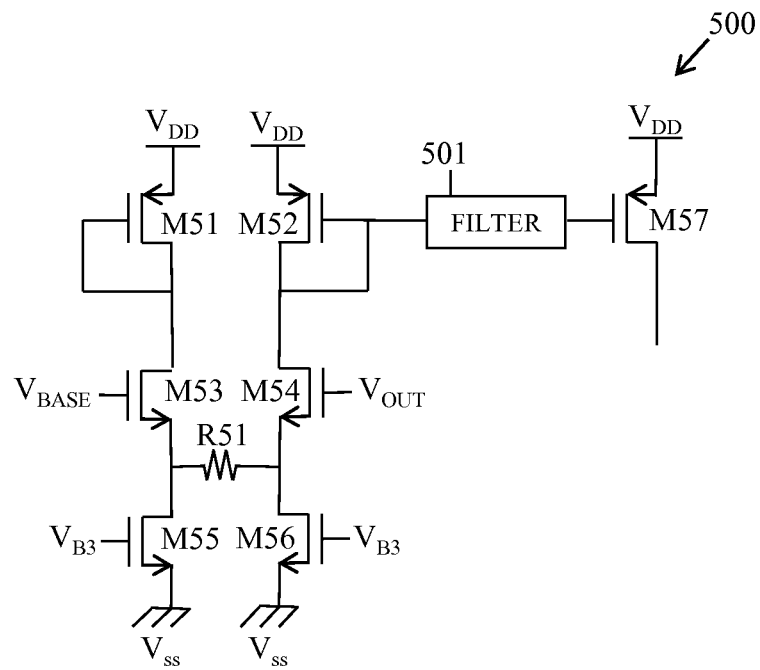
FIG. 5 is a schematic diagram of a transconductor including a filter according to an embodiment of the present disclosure.

FIG. 5 is a schematic diagram of a transconductor 500 according to an embodiment of the present disclosure for converting the voltage $V_{out}$ to a current $I_{out}$ that is proportional to $V_{out}$ and includes a filter 501 to reduce noise and voltage ripple.

Referring to FIG. 5, the transconductor 500 (e.g. a source-degenerated differential amplifier with diode-connected loads) includes a first PFET M51, a second PFET M52, a third PFET M57, a first NFET M53, a second NFET M54, a resistor R51, a third NFET M55, a fourth NFET M56, and a filter 501. Other types of transistors and arrangements are possible, as illustrated, for example, in FIGS. 4, 9, and 10 and described above and below.

The first PFET M51 has a source connected to a power supply voltage (e.g. $V_{DD}$) and a gate connected to its drain and the drain of the first NFET M53, wherein the first PFET M51 is connected as a diode. The second PFET M52 has a source connected to a power supply voltage (e.g. $V_{DD}$) and a gate connected to its drain, the drain of the second NFET M54, and an input of the filter 501, wherein the second PFET M52 is connected as a diode. The first NFET M53 has a drain connected to the drain and gate of the first PFET M51, a gate for receiving a reference voltage (e.g. $V_{BASE}$), and a source connected to a first end of a resistor R51 and the drain of the third NFET M55. The second NFET M54 has a drain connected to the drain and gate of the second PFET M52 and the input of the filter 501. The second NFET M54 also has a gate for receiving $V_{out}$, and a source connected to a second end of the resistor R51 and the drain of the fourth NFET M56. The third NFET M55 has a drain connected to the source of the first NFET M53 and the first end of the resistor R51. The third NFET M55 also has a gate for receiving a bias voltage (e.g.

$V_{B3}$) and a source connected to a ground potential (e.g. $V_{SS}$). The fourth NFET M56 has a drain connected to the source of the second NFET M54 and the second end of the resistor R51. The fourth NFET M56 also has a gate for receiving the bias voltage (e.g. $V_{B3}$) and a source connected to the ground potential (e.g. $V_{SS}$). The filter 501 has an input connected to the gate and drain of the second PFET M52 and the drain of the second NFET M54. The filter 501 also has an output connected to the gate of the third PFET M57. The third PFET M57 has a source connected to the power supply voltage (e.g. $V_{DD}$), a gate connected to the output of the filter 501, and a drain at which $I_{dynamic}$ appears. $I_{out}$ appears at the drain of the second PFET M52 and is proportional to $V_{out}$. $I_{dynamic}$ appears at the drain of the third PFET M57 and is equal to $I_{out}$ times the ratio of the size of the third PFET M57 divided by the size of the second PFET M52.

The $V_{BASE}$ voltage may be externally applied or internally generated using a Digital-to-Analog Converter (DAC). Changing $V_{BASE}$ changes the intercept of an $I_{out}$ versus $V_{out}$ curve. In addition, by changing the ratio of the size of the third PFET M57 to the size of the second PFET M52, the slope of an $I_{dynamic}$ versus $V_{out}$ curve can be changed.

The filter 501, for example, is resistor-capacitor (or RC) filter, where the resistor $R_{filt}$ is connected between the gates of the second PFET M52 and the third PFET M57, and the capacitor $C_{filt}$ is connected between the gate of the third PFET M57 and the power supply voltage (e.g. $V_{DD}$). However, other types of filters may be used. Alternatively, the power supply voltage to which the capacitor $C_{filt}$ in the filter 501 is connected may be any DC power supply voltage that is different from the power supply voltage to which an NFET or a PFET is connected.

Figure 6:
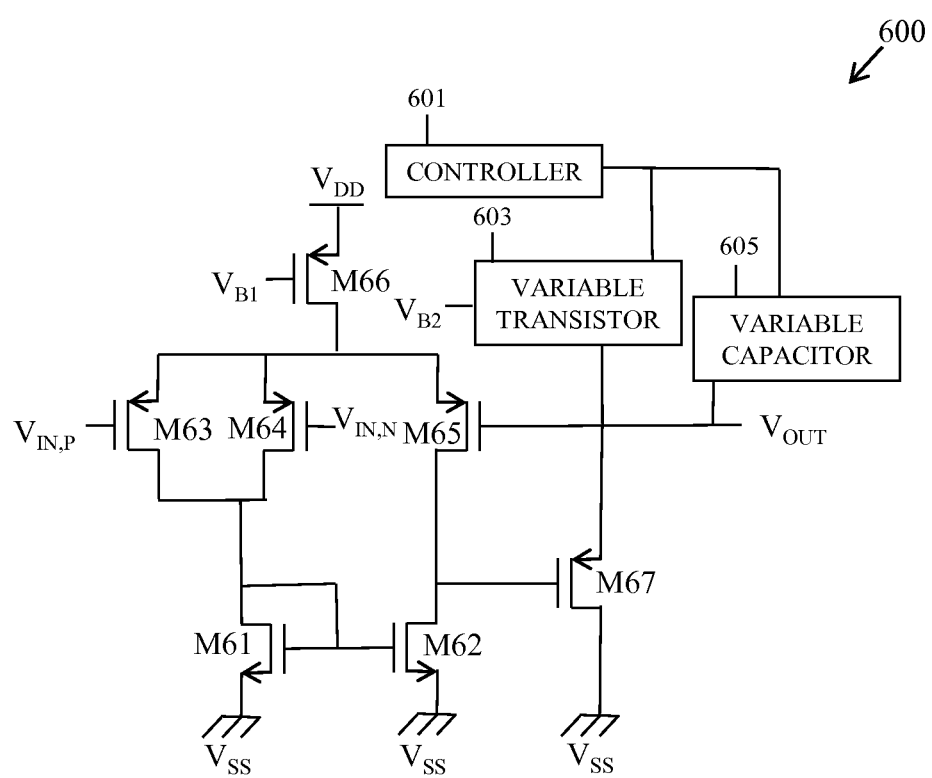
FIG. 6 is a schematic diagram of a combination differential envelope detector and full-wave rectifier according to an embodiment of the present disclosure.

FIG. 6 is a schematic diagram of a hybrid differential envelope detector and full-wave rectifier 600 according to an embodiment of the present disclosure, where a different configuration than that of FIG. 1 is used (i.e., NFET pulldown transistors instead of PFET pullup transistors, PFET input transistors instead of NFET input transistors, and a PFET discharge transistor instead of a PFET charging transistor).

Referring to FIG. 6, the hybrid differential envelope detector and full-wave rectifier 600 includes a first NFET M61, a second NFET M62, a first PFET M63, a second PFET M64, a third PFET M65, a fourth PFET M66, a fifth PFET M67, a controller 601, a variable transistor 603, and a variable capacitor 605. However, the present disclosure is not limited to a hybrid envelope detector and full-wave rectifier 600 that uses NFETs and PFETs or is configured as illustrated in FIG. 6. Other types of transistors and arrangements are possible, as illustrated, for example, in FIG. 1 and described above. The hybrid differential envelope detector and full-wave rectifier 600 of the present disclosure may be implemented with just PFETs, just NFETs, or using any other suitable transistor type (e.g. Bipolar, FinFET, GaAs, InGaAs, etc.).

The first NFET M61 has its source connected to a ground potential (e.g. $V_{SS}$), and its gate connected to its drain, the gate of the second NFET M62, the drain of the first PFET M63, and the drain of the second PFET M64.

The second NFET M62 has its source connected to the ground potential (e.g. $V_{SS}$), its gate connected to the gate of the first NFET M61, and its drain connected to the drain of the third PFET M65 and the gate of the fifth PFET M67.

The first PFET M63 has its drain connected to the drain of the first NFET M61 and the drain of the second NFET M62, and its source connected to the source of the second PFET M64, the source of the third PFET M65, and the drain of the fourth PFET M66. The gate of the first PFET M63 is the positive terminal of the hybrid differential envelope detector and full-wave rectifier 600 and receives a positive differential input voltage (e.g., $V_{in,p}$).

The second PFET M64 has its drain connected to the drain of the first NFET M61 and the drain of the first PFET M63, and its source is connected to the source of the first PFET M63, the source of the third PFET M65, and the drain of the fourth PFET M66. The gate of the second PFET M64 is the negative terminal of the hybrid differential envelope detector and full-wave rectifier 600 and receives a negative differential input voltage (e.g., $V_{in,n}$).

The third PFET M65 has its source connected to the source of the first PFET M63, the source of the second PFET M64, and the drain of the fourth PFET M66. The drain of the third PFET M65 is connected to the drain of the second NFET M62 and the gate of the fifth PFET M67. The gate of the third PFET M65 is connected to the source of the fifth PFET M67, a drain input of the variable transistor 603, and a first terminal input of the variable capacitor 605. The output voltage (e.g. $V_{out}$) of the hybrid differential envelope detector and full-wave rectifier 600 appears at the gate of the third PFET M65.

The fourth PFET M66 has its source connected to a power supply voltage (e.g. $V_{DD}$) and its drain is connected to the source of the first PFET M63, the source of the second PFET M64, and the source of the third PFET M65. The gate of the fourth PFET M66 receives a first bias voltage (e.g., $V_{B1}$), which, in conjunction with the size of the fourth PFET M66, establishes a bias current $I_{bias}$ for the input stage of the hybrid differential envelope detector and full-wave rectifier 600.

The fifth PFET M67 has its drain connected to the ground potential (e.g. $V_{SS}$). The gate of the fifth PFET M67 is connected to the drain of the second NFET M62 and the drain of the third PFET M65. The source of the fifth PFET M67 is connected to the gate of the third PFET M65, the drain output of the variable transistor 603 and the first terminal input of the variable capacitor 605. The output voltage (e.g. $V_{out}$) of the hybrid differential envelope detector and full-wave rectifier 600 appears at the source of the fifth PFET M67.

A controller 601 is connected to a control input bus of the variable transistor 603 and a control input bus of the variable capacitor 605. The controller 601 controls the effective size (e.g. width) of the variable transistor 603 and the effective capacitance of the variable capacitor 605.

The variable transistor 603 has a gate input for receiving a second bias voltage (e.g. $V_{B2}$), a control input bus connected to the controller 601, and a drain output connected to the gate of the third PFET M65, the source of the fifth PFET M67, and the first terminal of the variable capacitor 605. The output voltage (e.g. $V_{out}$) of the hybrid differential envelope detector and full-wave rectifier 600 appears at the drain output of the variable transistor 603.

The variable capacitor 605 has a control input bus connected to the controller 601 and a terminal connected to the gate of the third PFET M65, the source of the fifth PFET M67, and the drain output of the variable transistor 603. The output voltage (e.g. $V_{out}$) of the hybrid differential envelope detector and full-wave rectifier 600 appears at the first terminal of the variable capacitor 605. Alternatively, the second terminal of the variable capacitor 605 may be connected to a predetermined Direct Current (DC) voltage.

Figure 7:
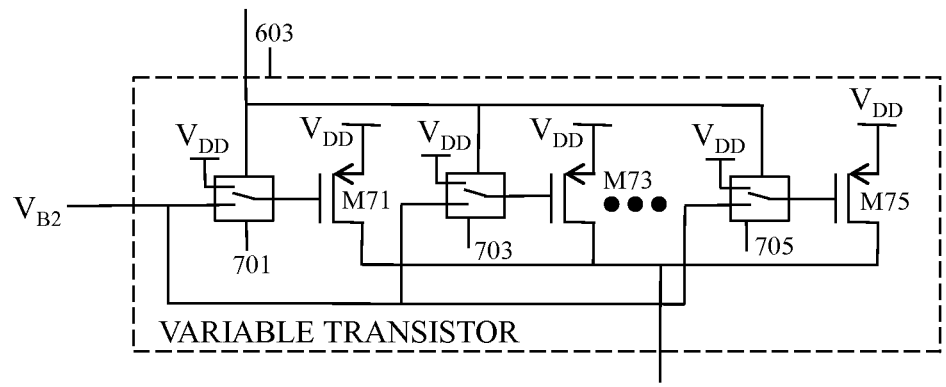
FIG. 7 is a schematic diagram of a variable transistor according to an embodiment of the present disclosure.

FIG. 7 is a schematic diagram of the variable transistor 603 according to an embodiment of the present disclosure.

Referring to FIG. 7, the variable transistor 603 includes n PFETs M71, M73, . . . , M75 and n switches 701, 703, . . . , 705. However, the present disclosure is not limited to a variable transistor 603 that uses PFETs or is configured as illustrated in FIG. 7. Other types of transistors and arrangements are possible, as illustrated, for example, in FIG. 2 and described above.

A bias voltage (e.g. $V_{B2}$) is received and connected to a first input terminal of each of the n switches 701, 703, . . . , 705. A second input terminal of each of the n switches 701, 703, . . . , 705 is connected to a power supply voltage (e.g., $V_{DD}$). A gate of each of the n PFETs M71, M73, . . . , M75 is connected to an output terminal of one of the n switches 701, 703, . . . , 705. A source of each of the n PFETs M71, M73, . . . , M75 is connected to the power supply voltage (e.g. $V_{DD}$). A drain of each of the n PFETs is connected together to form the drain output of the variable transistor 603.

A control input bus, having n inputs for receiving n control bits from the controller 601, is connected to the n switches 701, 703, . . . , 705, so that each control input of each of the n switches 701, 703, . . . , 705 receives one of the n control bits from the controller 601, which causes either the bias voltage (e.g. $V_{B2}$) or the power supply voltage (e.g. $V_{DD}$) to be applied to one of the gates of n PFETs M71, M73, . . . , M75. Applying the bias voltage (e.g. $V_{B2}$) to a gate of one of the n PFETs M71, M73, . . . , M75 turns on the corresponding PFET, and applying a power supply voltage (e.g. $V_{DD}$) to a gate of one of the n PFETs M71, M73, . . . , M75 turns off the corresponding PFET.

The control bits received from the controller 601 determine which of the n PFETs M71, M73, . . . , M75 is turned on or turned off. The number of PFETs that are turned on and the sizes of the PFETS that are turned on determine $I_{discharge}$. The sizes of the n PFETs M71, M73, . . . , M75 may be the same or they may be different from each other. If the sizes are different, the difference may be in a predetermined pattern (e.g., a ladder pattern for greater accuracy).

Figure 8:
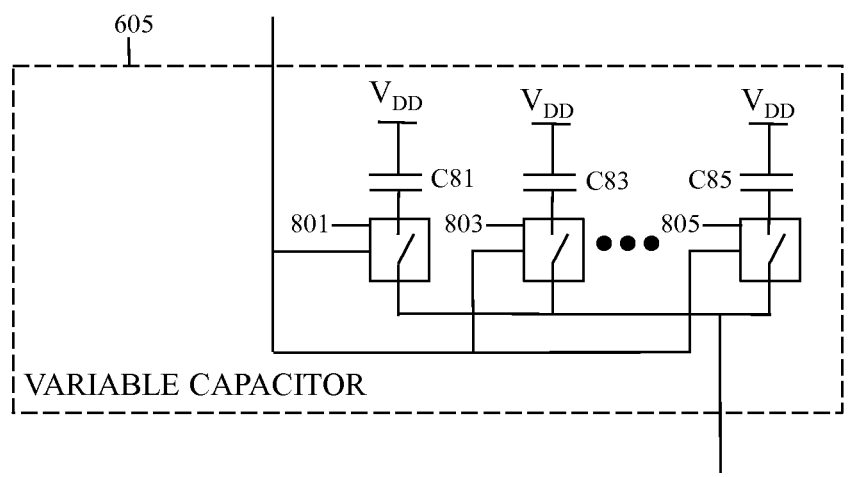
FIG. 8 is a schematic diagram of a variable capacitor according to an embodiment of the present disclosure.

FIG. 8 is a schematic diagram of the variable capacitor 605 according to an embodiment of the present disclosure.

Referring to FIG. 8, the variable capacitor 605 includes n capacitors C81, C83, . . . , C85 and n switches 801, 803, . . . , 805. However, the present disclosure is not limited to a variable capacitor 605 that is configured as illustrated in FIG. 8. Other types of arrangements are possible (e.g., series, series and parallel, etc.).

A first terminal of each of the n capacitors C81, C83, . . . , C85 is connected to an input terminal of each of the n switches 801, 803, . . . , 805. A second terminal of each of the n capacitors C81, C83, . . . , C85 is connected to a power supply voltage (e.g., $V_{DD}$). A second terminal of each of the n switches 801, 803, . . . , 805 is connected together to form the terminal of the variable capacitor 605. Alternatively, the second terminal of each of the n capacitors C81, C83, . . . , C85 may be connected to a DC voltage other than the power supply voltage (e.g., $V_{DD}$).

A control input bus, having n inputs for receiving n control bits from the controller 601, is connected to the n switches 801, 803, . . . , 805, so that each control input of each of the n switches 801, 803, . . . , 805 receives one of the n control bits from the controller 601, which causes one of the n capacitors C81, C83, . . . , C85 to be connected to, or disconnected from, the terminal of the variable capacitor 605.

The control bits received from the controller 601 determine which of the n capacitors C81, C83, . . . , C85 is connected to the terminal of the variable capacitor 605. The number of capacitors that are connected to the terminal of the variable capacitor 605, the sizes of the capacitors, and $I_{discharge}$ determine how closely $V_{out}$ tracks $V_{in,p}$ and $V_{in,n}$. The sizes of the n capacitors C81, C83, . . . , C85 may be the same or they may be different from each other. If the sizes are different, the difference may be in a predetermined pattern (e.g., a ladder pattern for greater accuracy).

Figure 9:
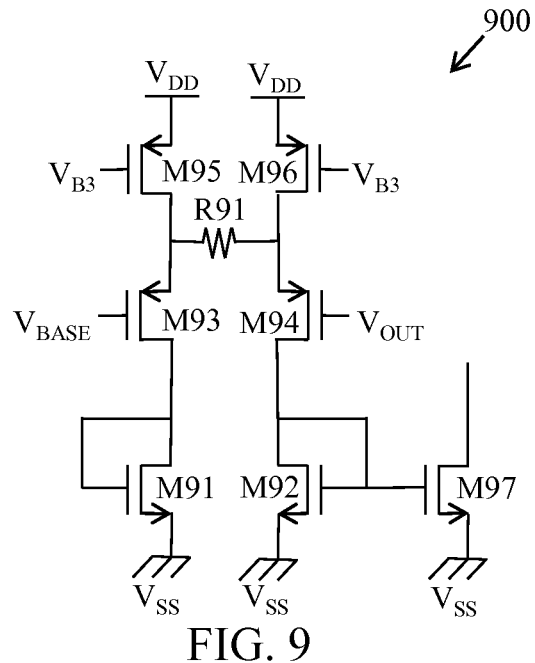
FIG. 9 is a schematic diagram of a transconductor according to an embodiment of the present disclosure.

FIG. 9 is a schematic diagram of a transconductor 900 according to an embodiment of the present disclosure for converting the voltage $V_{out}$ to a current $I_{out}$ that is proportional to $V_{out}$.

Referring to FIG. 9, the transconductor 900 includes a first NFET M91, a second NFET M92, a third NFET M97, a first PFET M93, a second PFET M94, a resistor R91, a third PFET M95, and a fourth PFET M96. Other types of transistors and arrangements are possible, as illustrated, for example, in FIGS. 4, 5, and 10 and described above and below.

The first NFET M91 has a source connected to a ground potential (e.g. $V_{SS}$) and a gate connected to its drain and the drain of the first PFET M93, wherein the first NFET M91 is connected as a diode. The second NFET M92 has a source connected to the ground potential (e.g. $V_{SS}$) and a gate connected to its drain, the drain of the second PFET M94, and the gate of the third NFET M97, wherein the second NFET M92 is connected as a diode. The first PFET M93 has a drain connected to the drain and gate of the first NFET M91, a gate for receiving a reference voltage (e.g. $V_{BASE}$), and a source connected to a first end of a resistor R91 and the drain of the third PFET M95. The second PFET M94 has a drain connected to the gate of the third PFET M97 and the drain and gate of the second NFET M92. The second PFET M94 also has a gate for receiving $V_{out}$, and a source connected to a second end of the resistor R91 and the drain of the fourth PFET M96. The third PFET M95 has a drain connected to the source of the first PFET M93 and the first end of the resistor R91. The third PFET M95 also has a gate for receiving a bias voltage (e.g. $V_{B3}$) and a source connected to a power supply voltage (e.g. $V_{DD}$). The fourth PFET M96 has a drain connected to the source of the second PFET M94 and the second end of the resistor R91. The fourth PFET M96 also has a gate for receiving the bias voltage (e.g. $V_{B3}$) and a source connected to the power supply voltage (e.g. $V_{DD}$). The third NFET M97 has a source connected to the ground potential (e.g. $V_{SS}$) and a gate connected to the gate and drain of the second NFET M92 and the drain of the second PFET M94. $I_{out}$ appears at the drain of the second NFET M92 and is proportional to $V_{out}$. $I_{dynamic}$ appears at the drain of the third NFET M97 and is equal to $I_{out}$ times the ratio of the size of the third NFET M97 divided by the size of the second NFET M92.

The $V_{BASE}$ voltage may be externally applied or internally generated using a Digital-to-Analog Converter (DAC). Changing $V_{BASE}$ changes the intercept of an $I_{out}$ versus $V_{out}$ curve. In addition, by changing the ratio of the size of the third NFET M97 to the size of the second NFET M92, the slope of an $I_{dynamic}$ versus $V_{out}$ curve can be changed.

Figure 10:
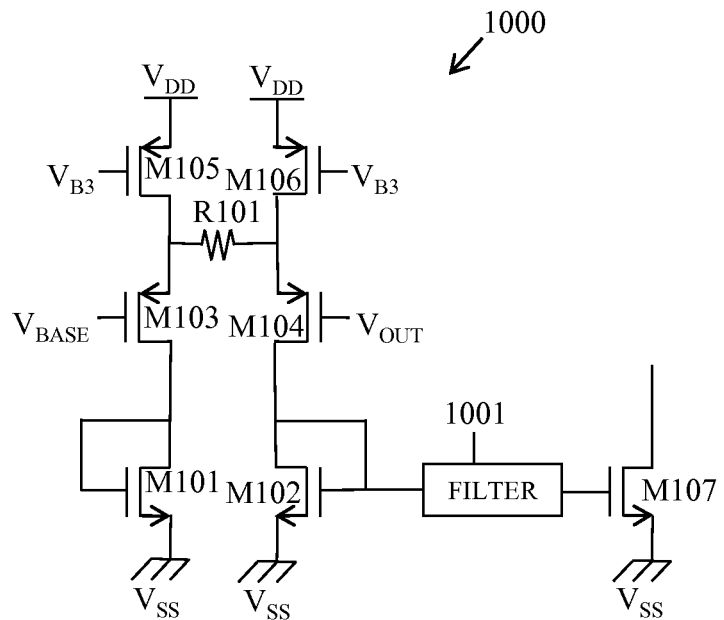
FIG. 10 is a schematic diagram of a transconductor including a filter according to an embodiment of the present disclosure.

FIG. 10 is a schematic diagram of a transconductor 1000 according to an embodiment of the present disclosure for converting the voltage $V_{out}$ to a current $I_{out}$ that is proportional to $V_{out}$ and includes a filter 1001 to reduce noise and voltage ripple.

Referring to FIG. 10, the transconductor 1000 includes a first NFET M101, a second NFET M102, a third NFET M107, a first PFET M103, a second PFET M104, a resistor R101, a third PFET M105, a fourth PFET M106, and a filter 1001. Other types of transistors and arrangements are possible, as illustrated, for example, in FIGS. 4, 5, and 9 and described above and below.

The first NFET M101 has a source connected to a ground potential (e.g. $V_{SS}$) and a gate connected to its drain and the drain of the first PFET M103, wherein the first NFET M101 is connected as a diode. The second NFET M102 has a source connected to the ground potential (e.g. $V_{SS}$) and a gate connected to its drain, the drain of the second PFET M104, and an input of the filter 1001, wherein the second NFET M102 is connected as a diode. The first PFET M103 has a drain connected to the drain and gate of the first NFET M101, a gate for receiving a reference voltage (e.g. $V_{BASE}$), and a source connected to a first end of the resistor R101 and the drain of the third PFET M105. The second PFET M104 has a drain connected to the drain and gate of the second NFET M102 and the input of the filter 1001. The second PFET M104 also has a gate for receiving $V_{out}$, and a source connected to a second end of the resistor R101 and the drain of the fourth PFET M106. The third PFET M105 has a drain connected to the source of the first PFET M103 and the first end of the resistor R101. The third PFET M105 also has a gate for receiving a bias voltage (e.g. $V_{B3}$) and a source connected to a power supply voltage (e.g. $V_{DD}$). The fourth PFET M106 has a drain connected to the source of the second PFET M104 and the second end of the resistor R101. The fourth PFET M106 also has a gate for receiving the bias voltage (e.g. $V_{B3}$) and a source connected to the power supply voltage (e.g. $V_{DD}$). The filter 1001 has an input connected to the gate and drain of the second NFET M102 and the drain of the second PFET M104. The filter 1001 also has an output connected to the gate of the third NFET M107. The third NFET M107 has a source connected to the ground potential (e.g. $V_{SS}$), a gate connected to the output of the filter 1001, and a drain at which $I_{dynamic}$ appears. $I_{out}$ appears at the drain of the second NFET M102 and is proportional to $V_{out}$. $I_{dynamic}$ appears at the drain of the third NFET M107 and is equal to $I_{out}$ times the ratio of the size of the third NFET M107 divided by the size of the second NFET M102.

The $V_{BASE}$ voltage may be externally applied or internally generated using a Digital-to-Analog Converter (DAC). Changing $V_{BASE}$ changes the intercept of an $I_{out}$ versus $V_{out}$ curve. In addition, by changing the ratio of the size of the third NFET M107 to the size of the second NFET M102, the slope of an $I_{dynamic}$ versus $V_{out}$ curve can be changed.

The filter 1001, for example, is resistor-capacitor (or RC) filter, where the resistor $R_{filt}$ is connected between the gates of the second NFET M102 and the third NFET M107, and the capacitor $C_{filt}$ is connected between the gate of the third NFET M107 and the ground potential (e.g. $V_{SS}$). However, other types of filters may be used. Alternatively, the ground potential (e.g. $V_{SS}$) to which the capacitor $C_{filt}$ in the filter 501 is connected may be any DC voltage that is different from the ground potential (e.g. $V_{SS}$).

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A hybrid envelope detector and full-wave rectifier, comprising:
    a first P-channel Field Effect Transistor (PFET), having a source connected to a power supply voltage, having a gate, and having a drain connected to the gate;
    a second PFET, having a source connected to the power supply voltage, having a gate connected to the gate of the first PFET, and having a drain;
    a first N-channel Field Effect Transistor (NFET), having a source, having a gate for receiving a first input voltage, and having a drain connected to the drain of the first PFET;
    a second NFET, having a source connected to the source of the first NFET, having a gate for receiving a second input voltage, and having a drain connected to the drain of the first NFET;
    a third NFET, having a source connected to the source of the first NFET, having a gate at which a voltage $V_{out}$ appears, and having a drain connected to the drain of the second PFET;
    a fourth NFET, having a source connected to a ground potential, having a gate for receiving a first bias voltage, and having a drain connected to the source of the first NFET;
    a fifth NFET, having a source connected to the gate of the third NFET, having a gate connected to the drain of the second PFET, and having a drain connected to the power supply voltage;
    a controller, having an output bus;
    a variable transistor, having an input for receiving a second bias voltage, having an input bus connected to the output bus of the controller, and having a drain input connected to the gate of the third NFET; and
    a variable capacitor, having an input bus connected to the output bus of the controller, and having an output terminal connected to the gate of the third NFET.

2. The hybrid envelope detector and full-wave rectifier of claim 1, wherein the hybrid envelope detector and full-wave rectifier may be implemented in a technology selected from Complementary Metal Oxide Semiconductor (CMOS), N-channel Metal Oxide Semiconductor (NMOS), P-channel Metal Oxide Semiconductor (PMOS), Gallium Arsenide (GaAs), Indium GaAs, Fin-shaped Field Effect Transistor (FinFET), and Bipolar.

3. The hybrid envelope detector and full-wave rectifier of claim 1, wherein the variable transistor comprises:
    a plurality of switches, wherein each of the plurality of switches includes a first input connected to the ground potential, a second input for receiving the second bias voltage, a third input connected to the input bus, and an output; and
    a plurality of NFETs, wherein each NFET includes a source connected to the ground potential, a gate connected to the output of one of the plurality of switches, and a drain connected to the drain input.

4. The hybrid envelope detector and full-wave rectifier of claim 1, wherein the variable capacitor comprises:
    a plurality of switches, wherein each of the plurality of switches includes a first input connected to the input bus, a second input, and an output connected to the output terminal; and
    a plurality of capacitors, wherein each capacitor has a first terminal connected to the ground potential, and a second terminal connected to the second input of one of the plurality of switches.

5. The hybrid envelope detector and full-wave rectifier of claim 1, further comprising:
    a third PFET, having a source connected to the power supply voltage, having a gate, and having a drain connected to the gate;
    a fourth PFET, having a source connected to the power supply voltage, having a gate, and having a drain connected to the gate;

a fifth PFET, having a source connected to the power supply voltage, having a gate connected to the gate of the fourth PFET, and having a drain at which appears $I_{dynamic}$;

a sixth NFET, having a source, having a gate for receiving a reference voltage $V_{BASE}$, and having a drain connected to the drain of the third PFET;

a seventh NFET, having a source, having a gate for receiving $V_{out}$, and having a drain connected to the drain of the fourth PFET;

a resistor, having a first terminal connected to the drain of the sixth NFET, and having a second terminal connected to the drain of the seventh NFET;

an eighth NFET, having a source connected to the ground potential, having a gate for receiving a third bias voltage, and having a drain connected to the source of the sixth NFET; and a ninth NFET, having a source connected to the ground potential, having a gate for receiving the third bias voltage, and having a drain connected to the source of the seventh NFET.

6. The hybrid envelope detector and full-wave rectifier of claim 1, wherein the first input voltage and the second input voltage are one of a signal for envelope detection and full-wave rectification, where the signal for envelope detection includes a narrowband signal, a single tone, a combination of at least two tones, or a $4^{th}$ Generation Long Term Evolution (4G LTE) signal that is one resource block wide, and where the signal for full-wave rectification includes a wideband signal, a $2^{nd}$ Generation (2G) Gaussian Minimum Shift Keying (GMSK) input signal, a 2G Enhanced Data rates for Global system for mobile communications Evolution (EDGE) input signal, a $3^{rd}$ Generation (3G) Wideband Code Division Multiple Access (WCDMA), or a 4G LTE input signal that is a full resource block wide.

7. The hybrid envelope detector and full-wave rectifier of claim 1, wherein the first NFET, the second NFET, and the third NFET are the same size.

8. The hybrid envelope detector and full-wave rectifier of claim 1, wherein the variable transistor is controlled to discharge 16 uA when in an envelope detection mode and 20 uA when in a full-wave rectification mode.

9. The hybrid envelope detector and full-wave rectifier of claim 1, wherein the variable capacitor is controlled to have an effective capacitance value of 0.1 pF in full-wave-rectification mode and 10 pF in envelope detection mode.

10. The hybrid envelope detector and full-wave rectifier of claim 1, wherein a size of the fifth PFET divided by the fourth PFET determines $I_{dynamic}$.

11. A hybrid envelope detector and full-wave rectifier, comprising:

a first N-channel Field Effect Transistor (NFET), having a source connected to a ground potential, having a gate, and having a drain connected to the gate;

a second NFET, having a source connected to the ground potential, having a gate connected to the gate of the first NFET, and having a drain;

a first P-channel Field Effect Transistor (PFET), having a source, having a gate for receiving a first input voltage, and having a drain connected to the drain of the first NFET;

a second PFET, having a source connected to the source of the first PFET, having a gate for receiving a second input voltage, and having a drain connected to the drain of the first PFET;

a third PFET, having a source connected to the source of the first PFET, having a gate at which a voltage $V_{out}$ appears, and having a drain connected to the drain of the second NFET;

a fourth PFET, having a source connected to a power supply voltage, having a gate for receiving a first bias voltage, and having a drain connected to the source of the first PFET;

a fifth PFET, having a source connected to the gate of the third PFET, having a gate connected to the drain of the second NFET, and having a drain connected to the ground potential;

a controller, having an output bus;

a variable transistor, having an input for receiving a second bias voltage, having an input bus connected to the output bus of the controller, and having a drain output connected to the gate of the third PFET; and a variable capacitor, having an input bus connected to the output bus of the controller, and having an output terminal connected to the gate of the third PFET.

12. The hybrid envelope detector and full-wave rectifier of claim 11, wherein the hybrid envelope detector and full-wave rectifier may be implemented in a technology selected from Complementary Metal Oxide Semiconductor (CMOS), N-channel Metal Oxide Semiconductor (NMOS), P-channel Metal Oxide Semiconductor (PMOS), Gallium Arsenide (GaAs), Indium GaAs, Fin-shaped Field Effect Transistor (FinFET), and Bipolar.

13. The hybrid envelope detector and full-wave rectifier of claim 11, wherein the variable transistor comprises:

a plurality of switches, wherein each of the plurality of switches includes a first input connected to the power supply voltage, a second input for receiving the second bias voltage, a third input connected to the input bus, and an output; and a plurality of PFETs, wherein each PFET includes a source connected to the power supply voltage, a gate connected to the output of one of the plurality of switches, and a drain connected to the drain output.

14. The hybrid envelope detector and full-wave rectifier of claim 11, wherein the variable capacitor comprises:

a plurality of switches, wherein each of the plurality of switches includes a first input connected to the input bus, a second input, and an output connected to the output terminal; and a plurality of capacitors, wherein each capacitor has a first terminal connected to the power supply voltage, and a second terminal connected to the second input of one of the plurality of switches.

15. The hybrid envelope detector and full-wave rectifier of claim 11, further comprising:

a third NFET, having a source connected to the ground potential, having a gate, and having a drain connected to the gate;

a fourth NFET, having a source connected to the ground potential, having a gate, and having a drain connected to the gate;

a fifth NFET, having a source connected to the ground potential, having a gate connected to the gate of the fourth NFET, and having a drain at which appears $I_{dynamic}$;

a sixth PFET, having a source, having a gate for receiving a reference voltage $V_{BASE}$, and having a drain connected to the drain of the third NFET;

a seventh PFET, having a source, having a gate for receiving $V_{out}$, and having a drain connected to the drain of the fourth NFET;

a resistor, having a first terminal connected to the source of the sixth PFET, and having a second terminal connected to the source of the seventh PFET;

an eighth PFET, having a source connected to the power supply voltage, having a gate for receiving a third bias voltage, and having a drain connected to the source of the sixth PFET; and a ninth PFET, having a source connected to the power supply voltage, having a gate for receiving the third bias voltage, and having a drain connected to the source of the seventh PFET.

16. The hybrid envelope detector and full-wave rectifier of claim 11, wherein the first input voltage and the second input voltage are one of a signal for envelope detection and full-wave rectification, where the signal for envelope detection includes a narrowband signal, a single tone, a combination of at least two tones, or a $4^{th}$ Generation Long Term Evolution (4G LTE) signal that is one resource block wide, and where the signal for full-wave rectification includes a wideband signal, a $2^{nd}$ Generation (2G) Gaussian Minimum Shift Keying (GMSK) input signal, a 2G Enhanced Data rates for Global system for mobile communications Evolution (EDGE) input signal, a $3^{rd}$ Generation (3G) Wideband Code Division Multiple Access (WCDMA), or a 4G LTE input signal that is a full resource block wide.

17. The hybrid envelope detector and full-wave rectifier of claim 11, wherein the first PFET, the second PFET, and the third PFET are the same size.

18. The hybrid envelope detector and full-wave rectifier of claim 11, wherein the variable transistor is controlled to discharge 16 uA when in an envelope detection mode and 20 uA when in a full-wave rectification mode.

19. The hybrid envelope detector and full-wave rectifier of claim 11, wherein the variable capacitor is controlled to have an effective capacitance value of 0.1 pF in full-wave-rectification mode and 10 pF in envelope detection mode.

20. The hybrid envelope detector and full-wave rectifier of claim 11, wherein a size of the fifth NFET divided by the fourth NFET determines $I_{dynamic}$.

* * * * *